United States Patent
Lee et al.

(10) Patent No.: US 7,986,531 B2
(45) Date of Patent: Jul. 26, 2011

(54) POWER SYSTEM MODULE AND METHOD OF FABRICATING THE SAME

(75) Inventors: Keun-hyuk Lee, Bucheon-si (KR);
Seung-won Lim, Bucheon-si (KR);
Seung-han Paek, Bucheon-si (KR);
Sung-min Park, Seoul (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 0 days.

(21) Appl. No.: 12/722,153

(22) Filed: Mar. 11, 2010

(65) Prior Publication Data

US 2010/0165576 A1    Jul. 1, 2010

Related U.S. Application Data

(63) Continuation of application No. 11/696,801, filed on Apr. 5, 2007, now Pat. No. 7,706,146.

(30) Foreign Application Priority Data

Apr. 20, 2006 (KR) .................. 10-2006-0035770

(51) Int. Cl.
*H05K 5/00* (2006.01)
(52) U.S. Cl. ...... 361/752; 361/730; 361/800; 174/138 E
(58) Field of Classification Search .................. 361/600, 361/715, 752–753, 790, 797, 800, 807, 810, 361/748, 760, 772, 773, 728–730; 174/138 E, 174/138 G
See application file for complete search history.

(56) References Cited

U.S. PATENT DOCUMENTS

| | | | |
|---|---|---|---|
| 5,513,072 | A | 4/1996 | Imaji et al. |
| 5,519,252 | A | 5/1996 | Soyano et al. |
| 5,543,586 | A | 8/1996 | Crane, Jr. et al. |
| 6,005,773 | A | 12/1999 | Rozman et al. |
| 6,060,772 | A | 5/2000 | Sugawara et al. |
| 6,144,571 | A | 11/2000 | Sasaki et al. |
| 6,421,244 | B1 | 7/2002 | Shinohara et al. |
| 6,521,983 | B1 | 2/2003 | Yoshimatsu et al. |
| 6,600,653 | B2 | 7/2003 | Koike et al. |
| 6,995,461 | B2 | 2/2006 | Soyano et al. |
| 7,208,833 | B2 | 4/2007 | Nobori et al. |
| 7,706,146 | B2 * | 4/2010 | Lee et al. ............... 361/752 |
| 2004/0227476 | A1 | 11/2004 | Guerra et al. |

* cited by examiner

*Primary Examiner* — Hung S Bui
(74) *Attorney, Agent, or Firm* — Thomas R. FitzGerald, Esq.; Hiscock & Barclay, LLP

(57) ABSTRACT

Provided are a power system module allowing a user's requirements to be easily met, and having economic practicality and high integration, and a manufacturing method thereof. The power system module includes a plastic case, a molding type power module package, a control circuit board, and at least one external terminal. The plastic case defines a bottom and a side wall. The molding type power module package is fixed to the bottom of the plastic case and includes at least a power device therein. The control circuit board is fixed to the side wall of the plastic case, includes at least a control device mounted thereon which is electrically connected to the power module package. The external terminal protrudes to outside the plastic case and is electrically connected to the control circuit board.

17 Claims, 5 Drawing Sheets

US 7,986,531 B2

POWER SYSTEM MODULE AND METHOD OF FABRICATING THE SAME

CROSS-REFERENCE TO RELATED PATENT APPLICATION

This application is a continuation of U.S. application Ser. No. 11/696,801 filed Apr. 5, 2007, which claims the benefit of Korean Patent Application No. 10-2006-0035770, filed on Apr. 20, 2006, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a power system module including a power device and a control device, and a manufacturing method of the power system module.

2. Description of the Related Art

Conventional power system modules are manufactured with a power device integrally packaged with a control device. Power devices include MOSFETs, bipolar transistors, and insulated gate bipolar transistors (IGBT). Control devices have a wide variety of control circuits depending on the type of product. An example of a power system module with a power device and a control device stacked and molded on a single lead frame is disclosed in U.S. Pat. No. 5,703,399 assigned to Mitsubishi, which is hereby incorporated by reference.

However, this type of conventional power system module has the following problems.

First, it is difficult to provide a power system module according to a customer's requirements. This is because the control circuitry differs according to the type of product, and the power system module for each product is different. Accordingly, in order to meet a customer's requirements, a different power system module must be provided for each case, which is problematic from a manufacturing point of view.

Also, conventional power system modules are costly because a control device must be added to an already expensive power module package. A control device can take up considerable volume, which increases the cost of the power system module and makes it difficult to employ complex control circuitry.

Additionally, conventional power system modules are difficult to highly integrate because a power device and a control device are both contained in a single package, resulting in low integration.

SUMMARY OF THE INVENTION

The present invention provides a power system module capable of easily fulfilling customers' specifications and being economically practical, and also capable of high integration.

The present invention also provides a manufacturing method of a power system module capable of easily fulfilling customers' specifications and being economically practical.

According to an aspect of the present invention, there is provided a power system module including a plastic case within which a first region and a second region are defined. A power module package of a molding-type may include at least a power device within, and be fixed to the first region of the plastic case. A control circuit board may have at least a control device mounted thereon, being fixed on the second region of the plastic case, and electrically connected to the power module package. At least one external terminal may be electrically connected to the control circuit board, and protrude to the outside of the plastic case.

The plastic case may include a fixing member within for fixing the external terminal to the control circuit board. Also, the control circuit board may have at least one first hole for the external terminal to pass through and fix to the fixing member.

The power module package may include at least one lead electrically connected to the power device, and the control circuit board may include at least one second hole, through which the lead of the power module package may pass through. Furthermore, the lead of the power module package and the second hole of the control circuit board may be electrically connected with conductive solder.

According to another aspect of the present invention, there is provided a manufacturing method of a power system module, including the following operations. A plastic case defining a first region and a second region within is provided. A molding type power module package containing at least one power device within is fixed to the first region of the plastic case. A control printed board with at least a control device mounted thereon is fixed to the second region of the plastic case. The control circuit board is electrically connected to the power module package. Also, in order for at least one external terminal to protrude outside of the plastic case, the external terminal is electrically connected to the control circuit board.

The electrical connecting of the external terminal may include passing the external terminal through at least one first hole of the control circuit board and fixing the external terminal to a fixing member inside the plastic case, and connecting the external terminal to the control circuit board using soldering.

The electrical connecting of the external terminal may include positioning at least one lead of the power module package to pass through at least one second hole of the control circuit board, and connecting the lead of the power module package to the control circuit board using solder.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
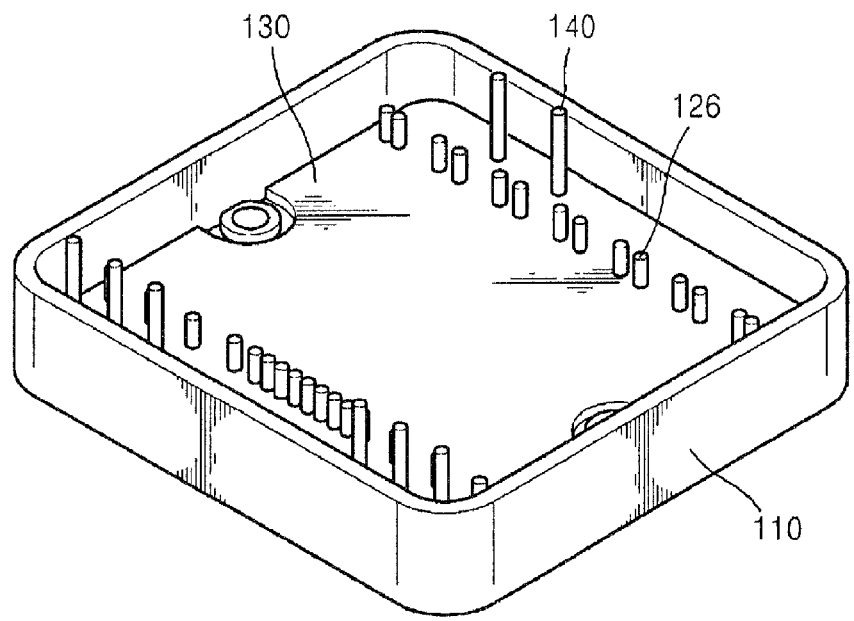
FIG. 1 is a perspective view of a power system module according to an embodiment of the present invention.
Figure 2:
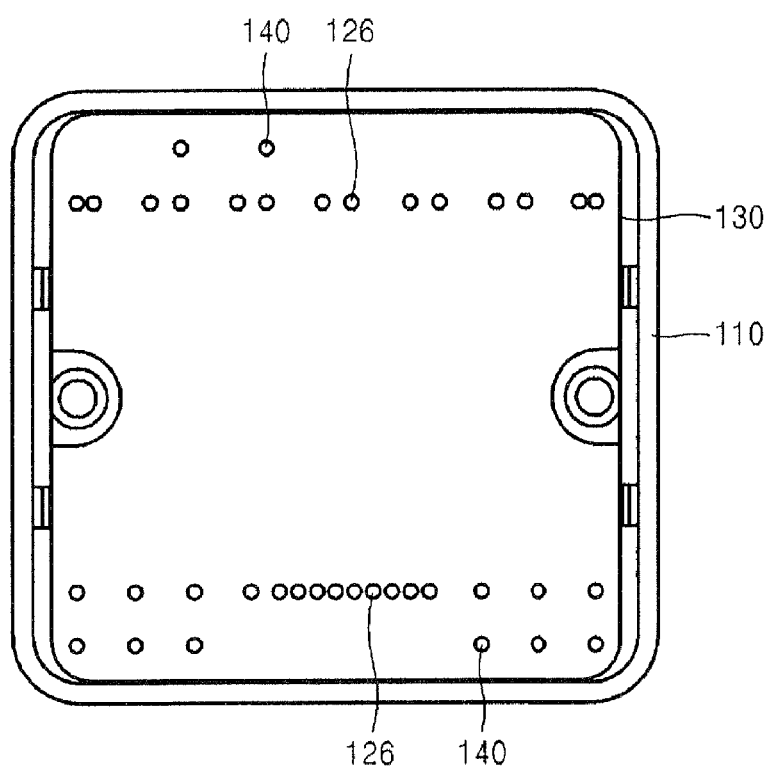
FIG. 2 is a top plan view of the power system module illustrated in FIG. 1.
Figure 3:
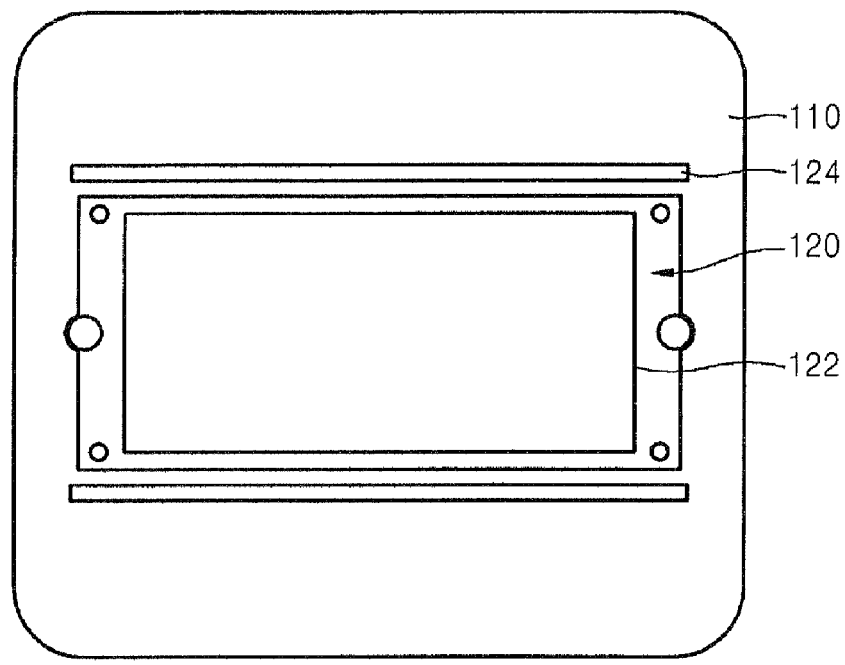
FIG. 3 is a bottom plan view of the power system module illustrated in FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will fully convey the concept of the invention to those skilled in the art. In the drawings, the relative size of various components may be exaggerated for clarity.

A power system module according to embodiments of the present invention may denote a system including a module with a power device and a module with a control device. That is, a power device and a control device may form the circuit of the power system. The power device may include a power MOSFET, a bipolar transistor, or an insulated gate bipolar transistor (IGBT), but is not limited to such inclusion.

FIGS. 1 through 4 illustrate a power system module 100 according to an embodiment of the present invention.

Referring to FIGS. 1 through 4, a power system module uses a plastic case 110 for integrating a power module package 120 and a control circuit board 130. For example, the power module package 120 and the control circuit board 130 may be respectively fixed inside the plastic case 110 and electrically connected to each other. At least one external terminal 140 electrically connected to the control circuit board 130 may be positioned to protrude out of the plastic case 110 (extend above the plastic case 110 in the drawings) in order to electrically connect an external device with the power system module.

A detailed description of each part of the power system module 100 will be provided below.

The power module package 120 may include at least a power device (not shown) packaged therein. The power module package 120 may also include a passive device (not shown) along with the power device. The power module package 120 may have a general molding type package structure. The power module package 120 may also have a case type package, as distinguished from a molded type package, with a power device packaged therein.

For example, the power device in the power package module 120 is mounted on a package substrate, and may be molded using a molding material, for example, an epoxy molding compound (EMC). In order to connect to an external device, at least one electrical terminal, such as a lead 126, is connected to the power device and is exposed to the outside through the molding material. For instance, the package substrate may include a direct bonded Cu (DBC) substrate or an insulated metal substrate (IMS).

Furthermore, the power module package 120 may further include a heat sink 122 that is exposed to the outside through the molding material. The heat sink 122 may function to dissipate heat from the power device to the outside. Moreover, the power module package 120 may further include a wall portion 124 extending vertically downward to the depth of the bottom edge of the heat sink 122. This wall portion 124 functions to assist in easily fixing the power module package 120 to the plastic case 110.

Figure 5:
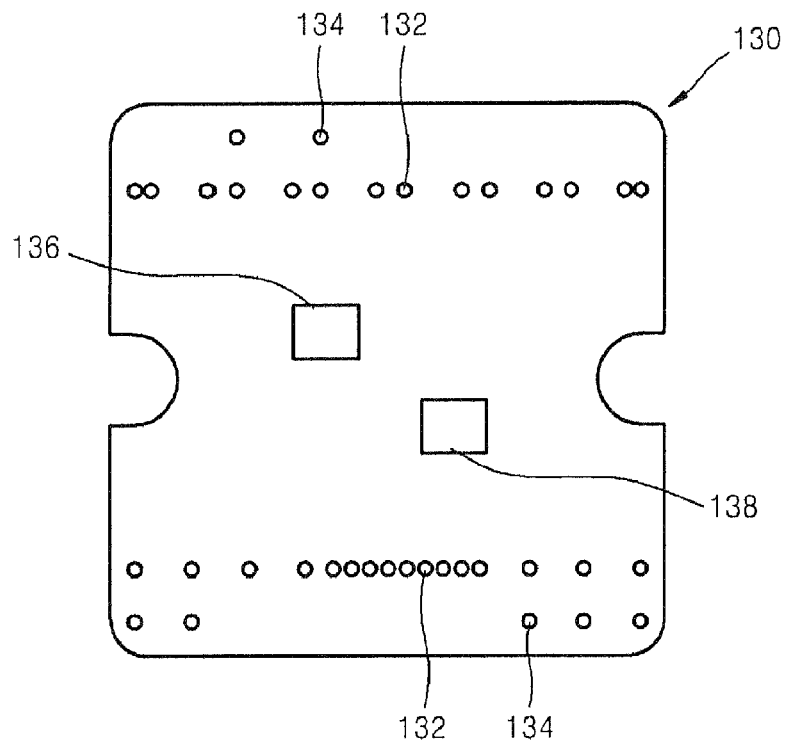
FIG. 5 is a plan view of a control circuit board of the power system module illustrated in FIG. 1.

FIG. 5 is a plan view of a control circuit board of the power system module illustrated in FIG. 1.

Figure 4:
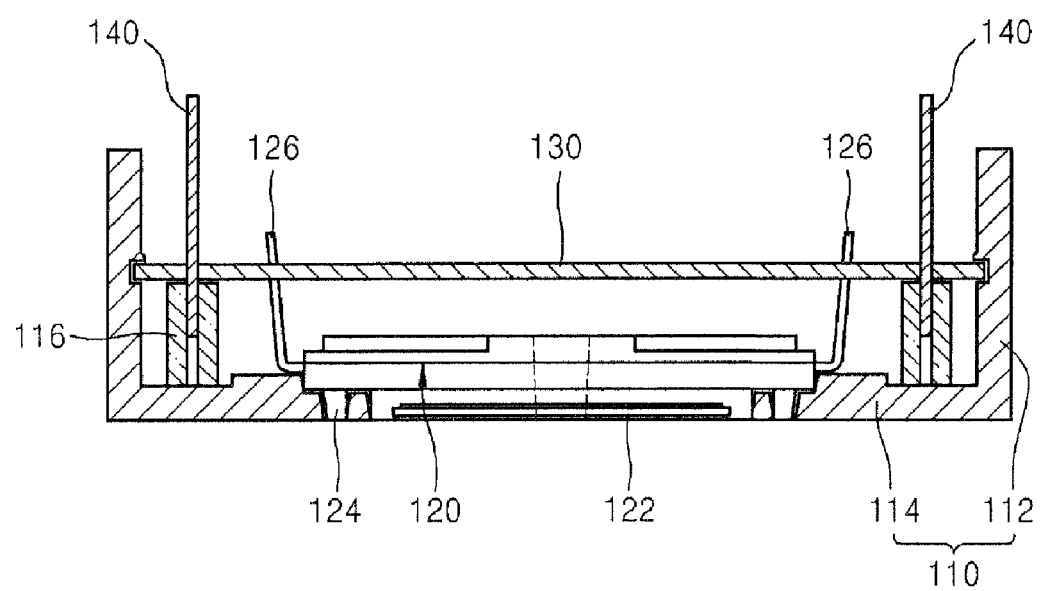
FIG. 4 is a cross-sectional view of the power system module illustrated in FIG. 1.

Referring to FIG. 5, the control circuit board 130 has at least the control device 136 mounted thereon. For example, the control circuit board 130 may include an active device or a passive device 138 in addition to the control device 136. The control circuit board 130 may include at least one first hole 132 and at least one second hole 134. The first hole 132 may be for connecting the control circuit board 130 to the power module package 120 (FIG. 4), and the second hole 134 may be for connecting the control circuit board 130 to the external terminal 140 (FIG. 4). The numbers of first and second holes 132 and 134 are not limited to those described in the current embodiment of the present invention.

For example, the control circuit board 130 may include predetermined conductive traces printed on a substrate, in other words, a printed circuit board (PCB). When a PCB is used, the control circuit board 130 may be easily configured in various ways to meet a user's specifications. That is, the control circuit board 130 that is made using printed circuit technology can more easily and inexpensively be changed for manufacturing purposes, compared to the molding type power module package 120 (FIG. 4).

Figure 6:
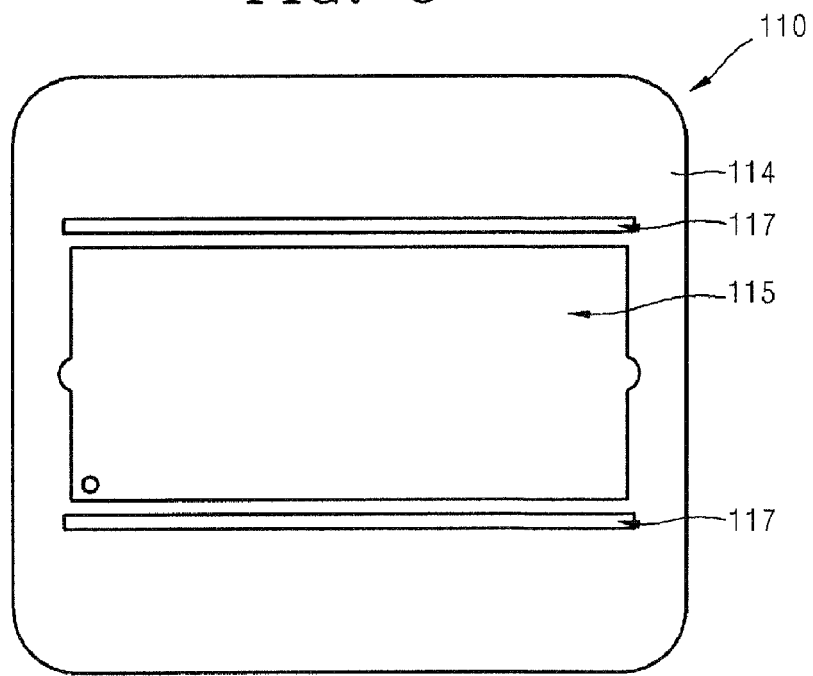
FIG. 6 is a plan view of a plastic case of the power system module in FIG. 1.
Figure 7:
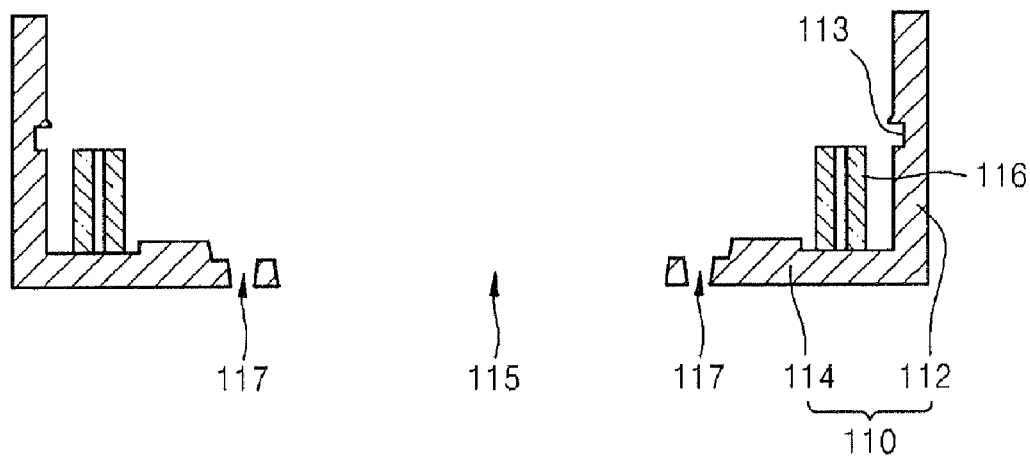
FIG. 7 is a cross-sectional view of the plastic case illustrated in FIG. 6.

FIG. 6 is a bottom plan view of a plastic case of the power system module illustrated in FIG. 1, and FIG. 7 is a cross-sectional view of the plastic case illustrated in FIG. 6.

Referring to FIGS. 6 and 7, the plastic case 110 includes the sidewall 112 and a floor 114. The sidewall 112 is formed to extend vertically upward from the upper surface of the edge around the entire floor 114. The floor 114 includes a through hole 115 formed therethrough, and the sidewall 112 includes a groove 113. The groove 113 may be formed in oppositely facing surfaces of the sidewall 112 or may be formed in the entire perimeter of the sidewall 112. The plastic case 110 may include polybutyleneterephtalate (PBT), polyphenynesulfide (PPS), or polypthalamide (PPA).

The plastic case 110 may further include a fixing member 116 within for fixing the external terminal 140 (FIG. 4). The fixing member 116 may be fixed vertically to the floor 114 by, for example, also forming the fixing member 116 when the plastic case 110 is formed. Also, the plastic case 110 may further include a pair of auxiliary through holes 117 for aiding in fixing the power module package 120 (FIG. 4) along with the through hole 115. The plastic case 110 is not limited to the form illustrated in FIGS. 6 and 7, and may adopt a variety of forms that fall within the scope of the present invention.

Referring again to FIGS. 1 through 4, the power module package 120 is fixed to a first region (i.e., the floor 114) inside the plastic case 110, and the control circuit board 130 is fixed to a second region (i.e., the sidewall 112) inside the plastic case 110. The power module package 120 may be formed so that the heat sink 122 is exposed through the through hole 115 (in FIG. 7) of the floor 114. In this case, the wall portion 124 passes and is exposed through the auxiliary through hole 117 (in FIG. 7) so that the power module package 120 can be more reliably fixed to the plastic case 110.

The control circuit board 130 may be inserted into the groove 113 (in FIG. 7) of the sidewall 114. However, the control circuit board 130 according to another embodiment of the present invention may be attached to the plastic case 110 using another method. For example, a fixing plate (not shown) may be attached to the sidewall 114, and the control circuit board 130 may be supported on the fixing plate. That is, the fixing of the control circuit board 130 may be fixed through various means according to the shape of the plastic case 110.

At least one lead 126 of the power module package 120 is electrically connected to the control circuit board 130. The lead 126 of the power module package 120 may be disposed to pass through the first hole 132 (FIG. 5) of the control circuit board 130 and electrically connected to the control circuit board 130 using conductive solder (not shown). However, in an alternative embodiment according to the present invention, the lead 126 of the power module package 120 may be connected to the control circuit board 130 by alternative means. For example, the lead 126 of the power module package 120 may simply contact the control circuit board 130 fixed to the control circuit board using conductive solder to electrically connect the two parts at the same time.

Thus, the connecting of the lead 126 of the power module package 120 and the control circuit board 130 may be controlled, and the power module package 120 and the control circuit board 130 may be formed in a desired circuit configuration according to a desired power system.

The external terminal 140 is disposed to pass through the second hole 134 (FIG. 5) of the control circuit board 130 and is electrically connected to the control circuit board 130 by conductive solder. Accordingly, the external terminal 140 may be further fixed to the fixing member 116 of the plastic case 110 below the control circuit board 130. The external terminal 140, for example, may be fixed to the plastic case 110 through a screw coupling inside the fixing member 116.

In one embodiment of the current invention, although the external terminal 140 is directly connected to the control circuit board 130, due to the fact that the control circuit board 130 is connected to the power module package 120, the external terminal 140 can function as an output terminal for the entire system circuit of the power module package 120 and the control circuit board 130. That is, the external terminal 140 performs the function of electrically connecting the power system module to an external device. Therefore, the number and position of the external terminal 140 may be adjusted according to the function of the power system module.

In another embodiment according to the present invention, the inside of the plastic case 110 may be filled with an insulating material which encloses the control circuit board 130.

In the above structure, the power module package 120 and the control circuit board 130 may be manufactured separately, and then fixed in a stacked format in the plastic case 110. That is, the power module package 120 and the control circuit board 130 may be provided separately. Accordingly, a control circuit board 130 may be added to a power module package 120 according to a customer's requirements, in order to easily manufacture another power system module.

In addition, because the power module package 120 and the control circuit board 130 can be manufactured separately, the volume of the power module package 120 (having a relatively high manufacturing cost) can be reduced, thereby also reducing its manufacturing cost. Furthermore, because the power module package 120 and the control circuit board 130 can be stacked within a plastic case 110, the circuit integration of both the power module package 120 and the control circuit board 130 can be increased, to obtain high integration of the power system module. Thus, the power system module according to embodiments of the present invention may be applied to products requiring highly integrated circuits, for example, automobiles.

Figure 8:
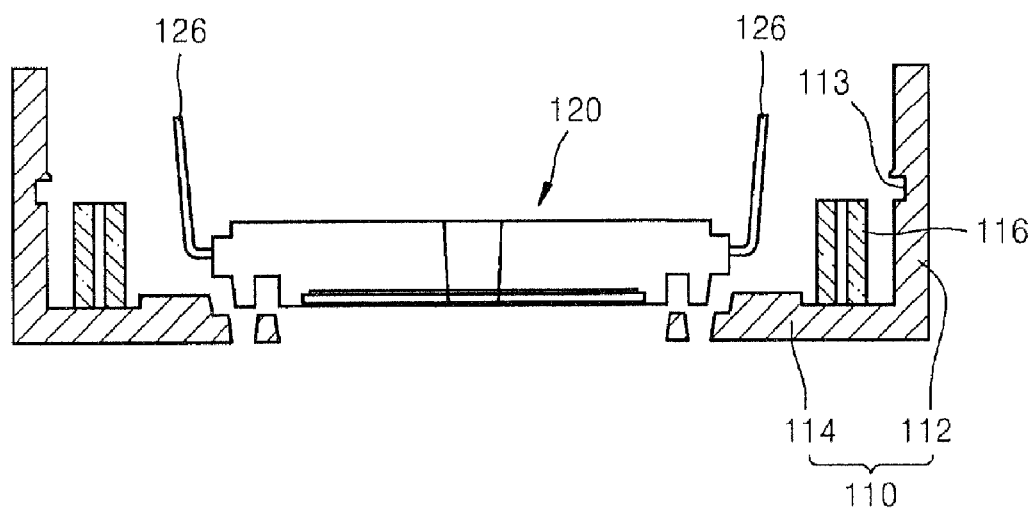
FIGS. 8 and 9 are cross-sectional views illustrating a manufacturing method of a power system module according to an embodiment of the present invention.
Figure 9:
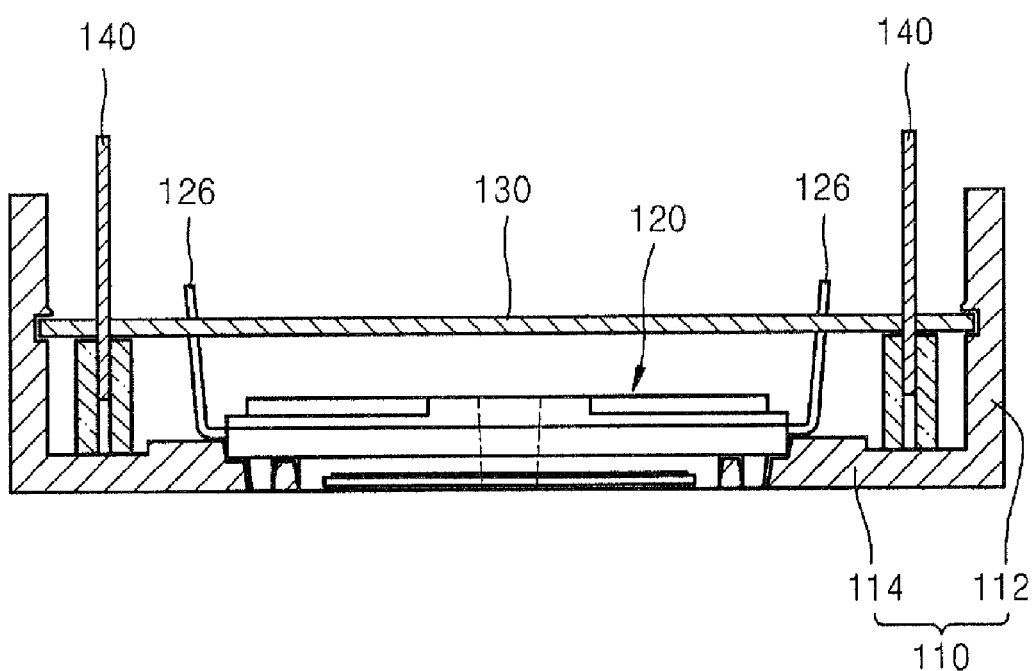

A manufacturing method of the above-described power system module will be set forth below. FIGS. 8 and 9 are cross-sectional views illustrating an manufacturing method of a power system module according to an embodiment of the present invention.

First, referring to FIGS. 6 and 7, a plastic case 110 defining a first region (for example, the floor 114) and a second region (for example, the sidewall 112) is provided. A detailed description of the plastic case 110 has already been given and is thus omitted below.

Referring to FIG. 8, a power module package 120 is fixed to the floor 114 of the plastic case 110. For example, in order to expose the heat sink 122 through the through hole 115 of the floor 114, the power module package 120 is first placed on the floor 114, and is fixed to the floor 114 using an adhesive printing or dotting method. At least one lead 126 of the power module package 120 is disposed vertically upward from the floor 114. Furthermore, in order to strengthen the fixing of the power module package 120, a curing operation may be further implemented.

Referring to FIG. 9, the control circuit board 130 is fixed to the sidewall 112 of the plastic case 110. For instance, the control circuit board 130 may be fixed to the plastic case 110 by inserting the edges of the control circuit board 130 in the groove 113 (in FIG. 7) of the sidewall 112. However, in other embodiments of the present invention, the control circuit board 130 may be fixed using alternative methods. For example, a fixing or support plate may be placed on the sidewall 112, and the control circuit board 130 may be installed on the fixing plate.

Before, after, or during the fixing of the control circuit board 130, the lead 126 of the power module package 120 is electrically connected to the control circuit board 130. For example, the lead 126 of the power module package 120 may be positioned to pass through the first hole 132 (FIG. 5) of the control circuit board 130 and may be electrically connected to the control circuit board 130 using soldering.

In alternative embodiments of the present invention, however, the leads 126 of the power module package 120 may be connected to the control circuit board 130 using alternative methods. For example, the leads 126 may be first placed in contact with the control circuit board 130 and then electrically connected and fixed to the control circuit board 130 using soldering.

Before, after, or during the fixing of the control circuit board 130, at least one external terminal 140 is electrically connected to the control circuit board 130. For example, an external terminal 140 is positioned to pass through a second hole 134 (in FIG. 5) of the control circuit board 140 and is electrically connected to the control circuit board 130 using soldering.

In addition, the external terminal 140 may be mechanically fixed to the plastic case 110. For example, the external terminal 140 may be screwed and coupled to a fixing member 116 at the bottom of the control circuit board 130, in order to fix the external terminal 140 to the plastic case 110.

The above-described manufacturing method, according to an embodiment of the present invention, allows the power module package 120 and the control circuit board 130 to be separately manufactured, in order to easily satisfy customers' demands. Moreover, this method of separately manufacturing the components can increase circuit integration of the power system module. Also, the power module package 120 (having a relatively expensive manufacturing cost) does not require a built-in control device, so that manufacturing costs can be lowered in the above-described manufacturing method.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power system module comprising:
a plastic case having a first region and a second region;
a molded power module package fixed in the first region of the plastic case, the molded power module package including at least a power device and at least one lead electrically connected to the power device;
a control circuit board fixed in the second region of the plastic case, the control circuit board including at least one first hole, at least one second hole, and at least a control device mounted thereon;

at least one external terminal protruding outside the plastic case, the external terminal passing through the first hole; and the plastic case further comprising a fixing member outside the molded power module package and fixed to the external terminal, wherein the lead is positioned to pass through the second hole.

2. The power system module of claim 1, wherein the external terminal is fixed to the plastic case through a coupling inside the fixing member.

3. The power system module of claim 1, wherein the second hole is positioned between the first hole and a center of the control circuit board.

4. The power system module of claim 1, wherein the lead is positioned within the plastic case.

5. The power system module of claim 1, wherein a height of the external terminal is greater than a height of the lead.

6. The power system module of claim 1, wherein the lead and the external terminal are electrically connected to the control circuit board by conductive solder.

7. The power system module of claim 1, wherein the plastic case comprises a floor and a sidewall, where the first region is defined by the floor and the second region is defined by the sidewall.

8. The power system module of claim 7, wherein the floor of the plastic case comprises a through hole exposing at least a portion of the first region to the outside.

9. The power system module of claim 8, wherein the power module package further comprises a heat sink passing through the through hole of the plastic case and being exposed to the outside.

10. The power system module of claim 7, wherein the sidewall of the plastic case comprises a groove into which the control circuit board is fixed.

11. The power system module of claim 1, wherein the power module package further comprises a passive device, and the control circuit board further comprises another active device or a passive device mounted thereon.

12. The power system module of the claim 1, wherein the external terminal is in direct contact with the plastic case.

13. The power system module of the claim 1, wherein the fixing member is in direct contact with the external terminal.

14. The power system module of the claim 1, wherein the fixing member is in direct contact with the control circuit board.

15. A power system module comprising:
a plastic case having a first and second region;
a molded power module package fixed in the first region of the plastic case, the molded power module package including at least a power device and at least one lead electrically connected to the power device;
a control circuit board fixed in the second region of the plastic case, the control circuit board including at least one first hole, at least one second hole, and at least a control device mounted thereon; and
at least one external terminal protruding outside the plastic case, the external terminal passing through the first hole,
wherein the lead is positioned to pass through the second hole,
wherein the second hole is positioned between the first hole and a center of the control circuit board.

16. A power system module comprising:
a plastic case having a base, a wall around the periphery of the base, a first region and a second region;
a molded power module package fixed in the first region of the plastic case, the molded power module package including at least a power device and at least one lead electrically connected to the power device;
a control circuit board fixed in the second region of the plastic case, the control circuit board including at least one first hole, at least one second hole, and at least a control device mounted thereon;
at least one fixing member for supporting an external lead, said fixing member disposed on the base and spaced from the molded power module; and
at least one external terminal supported by the fixing member and protruding outside the plastic case, the external terminal passing through the first hole,
wherein the lead is positioned to pass through the second hole, and
wherein an upper portion of the external terminal is at a height greater than an upper portion of the lead.

17. The power system module of the claim 16, wherein the fixing member is disposed between the control circuit board and the plastic case.

* * * * *